United States Patent
Ito

(10) Patent No.: US 7,984,361 B2
(45) Date of Patent: Jul. 19, 2011

(54) RAID SYSTEM AND DATA RECOVERY APPARATUS USING GALOIS FIELD

(75) Inventor: Toshio Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 863 days.

(21) Appl. No.: 12/006,994

(22) Filed: Jan. 8, 2008

(65) Prior Publication Data

US 2008/0184067 A1 Jul. 31, 2008

(30) Foreign Application Priority Data

Jan. 31, 2007 (JP) ................................. 2007-021662

(51) Int. Cl.
  *G11C 29/00* (2006.01)
(52) U.S. Cl. ....................................... 714/770; 714/804
(58) Field of Classification Search .................. 708/491; 707/999.202; 714/755, 769, 800, 770, 804
  See application file for complete search history.

(56) References Cited

U.S. PATENT DOCUMENTS

| | | | | |
|---|---|---|---|---|
| 4,994,994 A | * | 2/1991 | Burgess et al. | 708/491 |
| 7,343,546 B2 | * | 3/2008 | Edirisooriya et al. | 714/770 |
| 7,519,629 B2 | * | 4/2009 | Hafner et al. | 707/999.202 |
| 7,685,499 B2 | * | 3/2010 | Tsai et al. | 714/770 |
| 2008/0126907 A1 | * | 5/2008 | Edirisooriya et al. | 714/755 |

FOREIGN PATENT DOCUMENTS

JP  A 2000-259359  9/2000

OTHER PUBLICATIONS

Peter H. Anvin. "The mathematics of RAID-6," http://kernel.org/pub/linux/kernel/people/hpa/raid6.pdf, pp. 1-7, Dec. 1, 2004.

* cited by examiner

*Primary Examiner* — David Ton
(74) *Attorney, Agent, or Firm* — Greer, Burns & Crain, Ltd.

(57) ABSTRACT

Disclosed is an apparatus for recovering data in the case of single or double failures of N partial data blocks generated by dividing the data where N is a natural number greater than 1. The apparatus recovers the data on the basis of a Galois field product computation table including first and second search key data, and products of the first and second search key data. The first search key data includes possible symbol values. The second search key data includes a weighting value set and an inversed weighting value set. The weighting value set includes weighting values each assigned to one of the N partial data blocks and different from each other, and is closed under addition in the Galois field. The inversed weighting value set includes multiplicative inverses of the weighting values included in the weighting value set.

11 Claims, 10 Drawing Sheets

---

| GENERATION OF PARITY |
|---|
| $P = D0 + D1 + D2 + \cdots + D13$<br>$Q = A0 * D0 + A1 * D1 + A2 * D2 + \cdots + A13 * D13$ |
| Primitive Polynominal for GF($2^{16}$)<br>$= X^{16} + X^{12} + X^3 + X + 1$ |
| RECOVERY OF DATA |
| Single Disk Failure<br>$Di = (Ai)^{-1} * (A0 * D0 + \cdots + A(i-1) * D(i-1)$<br>$\qquad + A(i+1) * D(i+1) + \cdots + A13 * D13 + Q)$ |
| Double Disk Failures<br>$Dj = (Ai + Aj)^{-1} *$<br>$\qquad (A0 * D0 + A1 * D1 + \cdots + \underline{Ai * Di} + \cdots$<br>$\qquad + \underline{Aj * Dj} + \cdots + A13 * D13 + Q$<br>$\qquad + Ai * D0 + Ai * D1 + \cdots + \underline{Ai * Di} + \cdots$<br>$\qquad\qquad + \underline{Ai * Dj} + \cdots + Ai * D13 + Ai * P)$<br>$Di = D0 + D1 + \cdots + \underline{Di} + \cdots + Dj + \cdots + D13 + P$ |

FIG. 3

| GENERATION OF PARITY |
|---|
| $P = D0 + D1 + D2 + \cdots + D13$ <br> $Q = A0*D0 + A1*D1 + A2*D2 + \cdots + A13*D13$ |
| Primitive Polynominal for GF($2^{16}$) <br> $= X^{16} + X^{12} + X^3 + X + 1$ |
| RECOVERY OF DATA |
| Single Disk Failure <br> $Di = (Ai)^{-1} * (A0*D0 + \cdots + A(i-1)*D(i-1)$ <br> $\qquad + A(i+1)*D(i+1) + \cdots + A13*D13 + Q)$ |
| Double Disk Failures <br> $Dj = (Ai + Aj)^{-1} *$ <br> $\qquad (A0*D0 + A1*D1 + \cdots + \underline{Ai*Di} + \cdots$ <br> $\qquad + \underline{Aj*Dj} + \cdots + A13*D13 + Q$ <br> $\qquad + Ai*D0 + Ai*D1 + \cdots + \underline{Ai*Di} + \cdots$ <br> $\qquad + \underline{Ai*Dj} + \cdots + Ai*D13 + Ai*P)$ <br> $Di = D0 + D1 + \cdots + \underline{Di} + \cdots + Dj + \cdots + D13 + P$ |

FIG. 4

| j | (gfw(j,0),gfw(j,1),···,gfw(j,15)) |
|---|---|
| 1 | ( 1, 0, 0, 0, ···, 0) |
| 2 | ( 0, 1, 0, 0, ···, 0) |
| 3 | ( 1, 1, 0, 0, ···, 0) |
| 4 | ( 0, 0, 1, 0, ···, 0) |
| 5 | ( 1, 0, 1, 0, ···, 0) |
| 6 | ( 0, 1, 1, 0, ···, 0) |
| 7 | ( 1, 1, 1, 0, ···, 0) |
| 8 | ( 0, 0, 0, 1, ···, 0) |
| 9 | ( 1, 0, 0, 1, ···, 0) |
| 10 | ( 0, 1, 0, 1, ···, 0) |
| 11 | ( 1, 1, 0, 1, ···, 0) |
| 12 | ( 0, 0, 1, 1, ···, 0) |
| 13 | ( 1, 0, 1, 1, ···, 0) |
| 14 | ( 0, 1, 1, 1, ···, 0) |

FIG. 5

| j | $A_j$ |
|---|---|
| 1 | $\alpha^0$ |
| 2 | $\alpha^1$ |
| 3 | $\alpha^0 + \alpha^1 = \alpha^{49594}$ |
| 4 | $\alpha^2$ |
| 5 | $\alpha^0 + \alpha^2 = \alpha^{33653}$ |
| 6 | $\alpha^1 + \alpha^2 = \alpha^{49595}$ |
| 7 | $\alpha^0 + \alpha^1 + \alpha^2 = \alpha^{49358}$ |
| 8 | $\alpha^3$ |
| 9 | $\alpha^0 + \alpha^3 = \alpha^{33417}$ |
| 10 | $\alpha^1 + \alpha^3 = \alpha^{33654}$ |
| 11 | $\alpha^0 + \alpha^1 + \alpha^3 = \alpha^{1783}$ |
| 12 | $\alpha^2 + \alpha^3 = \alpha^{49596}$ |
| 13 | $\alpha^0 + \alpha^2 + \alpha^3 = \alpha^{4368}$ |
| 14 | $\alpha^1 + \alpha^2 + \alpha^3 = \alpha^{49359}$ |

FIG. 6

| Disk Number | $A_i$ |
|---|---|
| Disk 0 | $\alpha^0$ |
| Disk 1 | $\alpha^1$ |
| Disk 2 | $\alpha^{49594}$ |
| Disk 3 | $\alpha^2$ |
| Disk 4 | $\alpha^{33653}$ |
| Disk 5 | $\alpha^{49595}$ |
| Disk 6 | $\alpha^{49358}$ |
| Disk 7 | $\alpha^3$ |
| Disk 8 | $\alpha^{33417}$ |
| Disk 9 | $\alpha^{33654}$ |
| Disk 10 | $\alpha^{1783}$ |
| Disk 11 | $\alpha^{49596}$ |
| Disk 12 | $\alpha^{4368}$ |
| Disk 13 | $\alpha^{49359}$ |
| Disk 14 | $\alpha^{17712}$ |

| Single Failure | Double Failures | | $A_i$ |
|---|---|---|---|
| Disk 0 failure | | Disk 0, 1 failures | $\alpha^0$ |
| Disk 1 failure | Disk 0, 2 failures | | $\alpha^{65534}$ |
| Disk 2 failure | Disk 0, 1 failures | | $\alpha^{15941}$ |
| Disk 3 failure | Disk 0, 4 failures | Disk 1, 5 failures | $\alpha^{65533}$ |
| Disk 4 failure | Disk 0, 3 failures | Disk 1, 6 failures | $\alpha^{31882}$ |
| Disk 5 failure | Disk 0, 6 failures | Disk 1, 3 failures | $\alpha^{15940}$ |
| Disk 6 failure | Disk 0, 5 failures | Disk 1, 4 failures | $\alpha^{16177}$ |
| Disk 7 failure | Disk 0, 8 failures | Disk 1, 9 failures | $\alpha^{65532}$ |
| Disk 8 failure | Disk 0, 7 failures | Disk 1, 10 failures | $\alpha^{32118}$ |
| Disk 9 failure | Disk 0, 10 failures | Disk 1, 7 failures | $\alpha^{31881}$ |
| Disk 10 failure | Disk 0, 9 failures | Disk 1, 8 failures | $\alpha^{63752}$ |
| Disk 11 failure | Disk 0, 12 failures | Disk 1, 13 failures | $\alpha^{15939}$ |
| Disk 12 failure | Disk 0, 11 failures | Disk 1, 14 failures | $\alpha^{61167}$ |
| Disk 13 failure | Disk 0, 14 failures | Disk 1, 11 failures | $\alpha^{16176}$ |
| Disk 14 failure | Disk 0, 13 failures | Disk 1, 12 failures | $\alpha^{47823}$ |

FIG. 7

| Disk Number | $A_i$ | Single Failure | $A_i$ | Double Failures | $A_i$ |
|---|---|---|---|---|---|
| Disk 0 | $\alpha^0$ | Disk 0 failure | $\alpha^0$ | Disk 0,1 failures | $\alpha^{15941}$ |
| Disk 1 | $\alpha^1$ | Disk 1 failure | $\alpha^{65534}$ | Disk 0,2 failures | $\alpha^{31882}$ |
| Disk 2 | $\alpha^2$ | Disk 2 failure | $\alpha^{65533}$ | Disk 0,3 failures | $\alpha^{32118}$ |
| Disk 3 | $\alpha^3$ | Disk 3 failure | $\alpha^{65532}$ | Disk 0,4 failures | $\alpha^{63764}$ |
| Disk 4 | $\alpha^4$ | Disk 4 failure | $\alpha^{65531}$ | Disk 0,5 failures | $\alpha^{21152}$ |
| Disk 5 | $\alpha^5$ | Disk 5 failure | $\alpha^{65530}$ | Disk 0,6 failures | $\alpha^{64236}$ |
| Disk 6 | $\alpha^6$ | Disk 6 failure | $\alpha^{65529}$ | Disk 0,7 failures | $\alpha^{9790}$ |
| Disk 7 | $\alpha^7$ | Disk 7 failure | $\alpha^{65528}$ | Disk 0,8 failures | $\alpha^{61993}$ |
| Disk 8 | $\alpha^8$ | Disk 8 failure | $\alpha^{65527}$ | Disk 0,9 failures | $\alpha^{60536}$ |
| Disk 9 | $\alpha^9$ | Disk 9 failure | $\alpha^{65526}$ | Disk 0,10 failures | $\alpha^{42304}$ |
| Disk 10 | $\alpha^{10}$ | Disk 10 failure | $\alpha^{65525}$ | Disk 0,11 failures | $\alpha^{56270}$ |
| Disk 11 | $\alpha^{11}$ | Disk 11 failure | $\alpha^{65524}$ | Disk 0,12 failures | $\alpha^{62937}$ |
| Disk 12 | $\alpha^{12}$ | Disk 12 failure | $\alpha^{65523}$ | Disk 0,13 failures | $\alpha^{17948}$ |
| Disk 13 | $\alpha^{13}$ | Disk 13 failure | $\alpha^{65522}$ | Disk 0,14 failures | $\alpha^{19580}$ |
| Disk 14 | $\alpha^{14}$ | Disk 14 failure | $\alpha^{65521}$ | ... | ... |

FIG. 10  PRIOR ART

| |
|---|
| $P = D0 + D1 + D2 + D3 + D4$ |
| $Q = A0*D0 + A1*D1 + A2*D2 + A3*D3 + A4*D4$ |
| [GALOIS FIELD]<br>A finite number of Points: $GF(2^{16}) \ni 0, \alpha^0, \alpha^1, \ldots, \alpha^{65534}$<br><br>Four Arithmetic Operations: $\alpha^1 + \alpha^1 = 0, \ \alpha^2 \times \alpha^3 = \alpha^5$ |
| Recovery of Single Failure<br>$D1 = (A1)^{-1} * (A0*D0 + A2*D2 + A3*D3 + A4*D4 + Q)$ |
| Recovery of Double Failures<br>$D2 = (A1 + A2)^{-1} * (A0*D0 + A3*D3 + A4*D4 + Q$<br>$\quad + A1*D0 + A1*D3 + A1*D4 + A1*P)$<br><br>$D1 = D0 + D2 + D3 + D4 + P$ |

RAID SYSTEM AND DATA RECOVERY APPARATUS USING GALOIS FIELD

BACKGROUND OF THE INVENTION

1. Field of the Invention

The present invention relates to redundant array of independent disks (RAID) systems for generating parities for data and for recovering data using the generated parities, and also to data recovery apparatuses using Galois fields. More particularly, the invention relates to a RAID system for generating parities for data by using a Galois field multiplication table and for recovering data using the generated parities, and also to a data recovery apparatus using a Galois field.

2. Description of the Related Art

Due to the recent spread of digitization, data is becoming more and more important. Accordingly, data recovery techniques for recovering lost data from other data and parities are required. One approach to recovering data from double failure is RAID-6. In this RAID-6 scheme, a linear redundancy technique has been proposed, as disclosed in, for example, Japanese Unexamined Patent Application Publication No. 2000-259359 (FIGS. 5 and 6).

This technique is described below in the context of the configuration of the RAID-6 system shown in FIG. 8. Five data disk units (hard disk drives) 101, 102, 103, 104, and 105 and two parity disk units (hard disk drives), i.e., disk units 106 and 107, are connected to a RAID controller 110 through a bus 112 therebetween.

In the linear redundancy technique, two parities are generated from data. The first parity P is generated, as shown in FIG. 10, as a result of adding data items D0, D1, D2, D3, and D4, i.e., calculating exclusive OR (XOR), as in the known RAID-5 scheme. The first parity P is stored in the parity disk unit 106. The sign "+" represents XOR in the following description. A data item (for example, D0, D1, D2, D3, . . . ) on which a Galois field computation is performed is also described as "symbol" in the following description.

The second parity Q is generated by weighting the data items D0, D1, D2, D3, and D4 using Galois field product generators A0 through A4 ($\alpha^0$ through $\alpha^4$) respectively, and by computing XOR of the resulting values. That is, the second parity Q is generated by the following equation (1).

$$Q = A0*D0 + A1*D1 + A2*D2 + A3*D3 + A4*D4 \quad (1)$$

The second parity Q is then stored in the second parity disk unit 107.

Among the Galois field generators A0 through A4 ($\alpha^0$ through $\alpha^4$), one Galois field generator is assigned to each of the data disk units 101, 102, 103, 104, and 105. In order to recover data from a single disk failure or double disk failures, it is necessary that the Galois field generators assigned to the data disk units 101, 102, 103, 104, and 105 be different from each other. For example, if the number of data bits is 16, as shown in FIG. 10, $2^{16}$ finite elements are provided as the Galois field GF ($2^{16}$). Additionally, four arithmetic operations can be performed on the Galois field according to a predetermined rule (XOR of Galois field generators having the same order results in 0 (e.g., $\alpha^1 + \alpha^1 = 0$), and multiplication of Galois field generators results in the addition of those orders (e.g., $\alpha^2 \times \alpha^3 = \alpha^5$)). The linear redundancy technique allows distribution of parities and is effective for detecting the occurrence of double disk failures and recovering data from such failures.

In the case of a single disk failure occurring in, for example, the data disk unit 102, to recover data D1, the following equation (2) is obtained by modifying equation (1).

$$A1*D1 = A0*D0 + A2*D2 + A3*D3 + A4*D4 + Q \quad (2)$$

From equation (2), by the use of the parity Q, and data other than data D1, i.e., data D0 and D2 through D4, and Galois field generators, such as A0 and A2 through A4 and $(A1)^{-1}$, data D1 can be recovered according to the following equation (3).

$$D1 = (A1)^{-1}*(A0*D1 + A2*D2 + A3*D3 + A4*D4 + Q) \quad (3)$$

Data D1 can be recovered by the use of the parity P. However, by considering the case where the reliability of the parity P is low, an algorithm for recovering data D1 using the parity Q is prepared.

In the case of double disk failures occurring in, for example, the data disk units 102 and 103, to recover data D1 and D2, the following equation (4) is obtained from equation (1).

$$A1*D1 + A2*D2 = A0*D0 + A3*D3 + A4*D4 + Q \quad (4)$$

If the right side of equation (4) is represented by F, the following equation (5) is found.

$$A1*D1 + A2*D2 = F \quad (5)$$

Then, by modifying the equation for generating the parity P shown in FIG. 10, the following equation (6) is obtained.

$$D1 + D2 = D0 + D3 + D4 + P \quad (6)$$

If the right side of equation (6) is represented by G, the following equation (7) is found.

$$D1 + D2 = G \quad (7)$$

By the use of equations (5) and (7), simultaneous equations for the data D1 and D2 are established and then solved. First of all, by multiplying equation (7) by A1, the following equation (8) is obtained.

$$A1*D1 + A1*D2 = A1*G \quad (8)$$

By adding equations (XOR) (5) and (8), the following equation (9) is determined.

$$(A1 + A2)*D2 = F + A1*G \quad (9)$$

By modifying equation (9), the following equation (10) for the data D2 is obtained.

$$D2 = (A1 + A2)^{-1}*(F + A1*G) \quad (10)$$

By modifying equation (7), the following equation (11) for the data D1 is obtained.

$$D1 = D2 + G \quad (11)$$

By substituting F in equations (4) and (5) and G in equations (6) and (7) into the right side of equation (10), the following equation (12) for recovering the data D2 is obtained.

$$D2 = (A1 + A2)^{-1} * (A0 * D0 + A3 * D3 + A4 * D4 + Q + A1 * D0 + A1 * D3 + A1 * D4 + A1 * P) \quad (12)$$

Similarly, by substituting G in equations (6) and (7) into the right side of equation (11), the following equation (13) for recovering the data D1 is obtained.

$$D1 = D0 + D2 + D3 + D4 + P \quad (13).$$

In generating parities and recovering data by utilizing a Galois field, two variables, such as data D and Galois field generator A, are necessary for executing Galois field product computation. Accordingly, a longer processing time is required for generating parities than that for XOR computation of the RAID-5 scheme, i.e., computation of the ordinary parity P, thereby reducing the performance.

To simplify the Galois field product computation, the following technique, disclosed in, for example, Japanese Unexamined Patent Application Publication No. 2000-259359 (FIGS. 5 and 6), has been proposed. In this technique, a Galois field product computation table 120 storing multiplication results of data D and Galois field generator A is generated, as shown in FIG. 9, and by referring to the Galois field product computation table 120, product computation results for individual data items and Galois field generators are obtained.

It is now assumed that, in a RAID system, n data and two parities are used and that one symbol has 16 bits and the Galois field is $GF(2^{16})$. In this case, the Galois field generators A required for weighting the data disks are represented by $\alpha^{i1}, \alpha^{i2}, \alpha^{i3}, \ldots, \alpha^{in}$ ($ij \in \{0, 1, \ldots, 65534\}$).

When using the above-described Galois field generators A, the weighting values used for recovering data from single-disk failures are $\alpha^{-i1}, \alpha^{-i2}, \alpha^{-i3}, \ldots, \alpha^{-in}$, as expressed by equation (3). The weighting values used for double disk failures can be determined by the following equation (14) from equation (12).

$$(\alpha^{ij}+\alpha^{ik})^{-1} (j=1, \ldots, n-1, k=j+1, \ldots, n) \quad (14)$$

Accordingly, if the weighting values are randomly selected, as in the related art, weighting values used for single disk failures and weighting values used for double disk failures are not overlapped, and thus, the number of Galois field generators required is equal to the sum of the number n of data disk units, the number n of possible single disk failures, and the number n(n−1)/2 of possible double disk failures.

The number of possible values that can be taken as one symbol (16-bit) D is $2^{16}=65536$. Accordingly, if the Galois field product computation table 120 storing the Galois field generators used for weighting and possible symbol values for one symbol is generated, as shown in FIG. 9, (n+n+n(n−1)/2)×65536 data elements are required. For example, if n=14, 119×65536 data elements are required. This significantly increases the data amount of the tables, i.e., the space of the memory, which makes the RAID system and the data recovery apparatus expensive.

SUMMARY

It is an object of the present invention to provide an apparatus for recovering data in which the data amount of a Galois field product computation table can be decreased.

It is another object of the present invention to provide an apparatus, the cost of which can be reduced by decreasing the data amount of a Galois field product computation table.

It is still another object of the present invention to provide an apparatus in which fast product computation can be implemented by decreasing the data amount of a Galois field product computation table.

According to the present invention, there is provided an apparatus for recovering data. The apparatus recovers the data in the case of single or double failures of N partial data blocks generated by dividing the data, where N is a natural number greater than 1. The apparatus recovers the data on the basis of a first parity data generated by combining the N partial data blocks, a second parity data generated by performing in a Galois field a product operation on symbols acquired from the N partial data blocks, and a Galois field product computation table.

The Galois field product computation table includes first search key data, a second search key data, and a product of the first search key data and the second search key data for each pair of the first search key data and the second search key data. The first search key data includes possible symbol values, and the second search key data includes a weighting value set and an inversed weighting value set. The weighting value set includes weighting values each assigned to one of the N partial data blocks and different from each other, and is closed under addition in the Galois field. The inversed weighting value set includes weighting values each being a multiplicative inverse of one the weighting values included in the weighting value set.

The apparatus can recover the data in the case of double failures of the N partial data blocks by using weighting values included in the inversed weighting value set of the Galois field product computation table, thereby reducing a size of the Galois field product computation table.

According to an embodiment of the present invention, the following advantages can be obtained. By the use of the weighting values for data storage units such that a set of the weighting values (a weighting value set) is closed under addition (XOR), a Galois field product computation table storing the above-described weighting values, the weighting values for recovering data from single disk failures, which are multiplicative inverse of the above-described weighting values, and multiplication results (products) of possible symbol values and weighting values, can be configured. This table can also be used when recovering data from double disk failures. Thus, the data amount of table can be reduced, which contributes to reducing the cost of a RAID system and a data recovery apparatus.

BRIEF DESCRIPTION OF THE DRAWINGS

FIG. 3 illustrates algorithms for generating parties P and Q and recovering data in accordance with an embodiment of the present invention;

FIG. 4 illustrates weighting vectors for the data disk units shown in FIG. 1, in accordance with an embodiment of the present invention;

FIG. 5 illustrates the weighting values for the data disk units by using the weighting vectors shown in FIG. 4, in accordance with an embodiment of the present invention;

FIG. 6 illustrates the weighting values for recovering data from single disk failures or double disk failures by using the weighting values for the data disk units in accordance with an embodiment of the present invention;

FIG. 7 illustrates the weighting values for recovering data from single disk failures or double disk failures by using the weighting values for the data disk units in accordance with an example of the related art;

FIG. 10 illustrates an example of Galois field product computation of the related art.

DESCRIPTION OF THE PREFERRED EMBODIMENTS

The present invention is described below in the order of a RAID system and a Galois field product computation table in accordance with an embodiment, and modified examples. However, the present invention is not restricted to this configuration.

Figure 1:
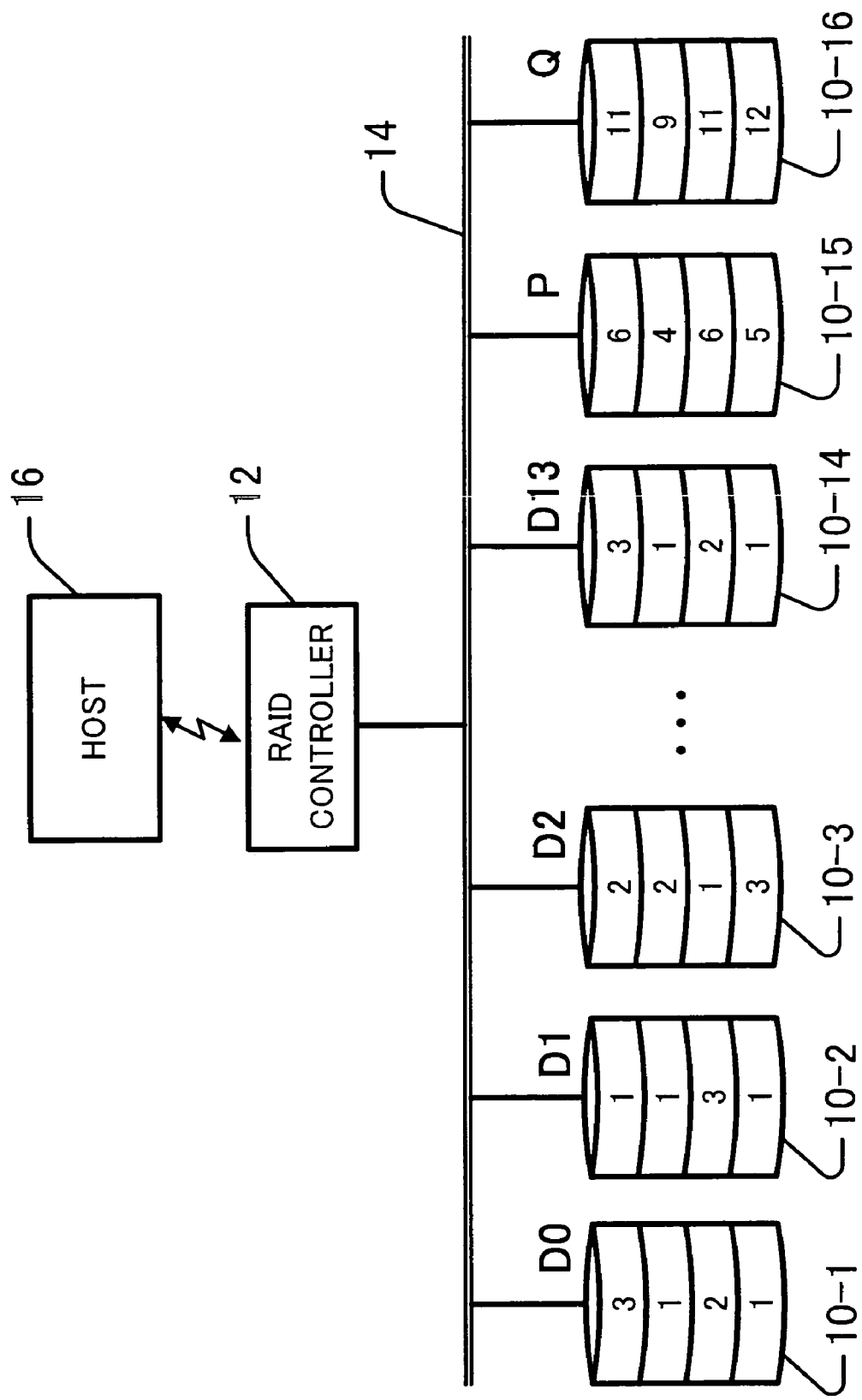
FIG. 1 is a block diagram illustrating a RAID system in accordance with an embodiment of the present invention.
Figure 2:
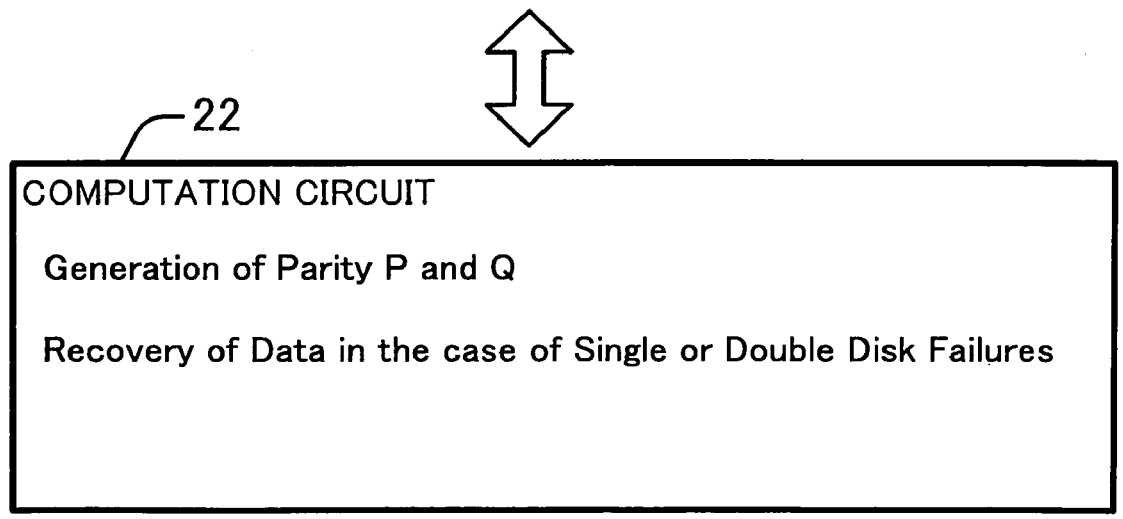
FIG. 2 illustrates a Galois field product computation table and a computation circuit for generating parities and recovering data in accordance with an embodiment of the present invention.
Figure 8:
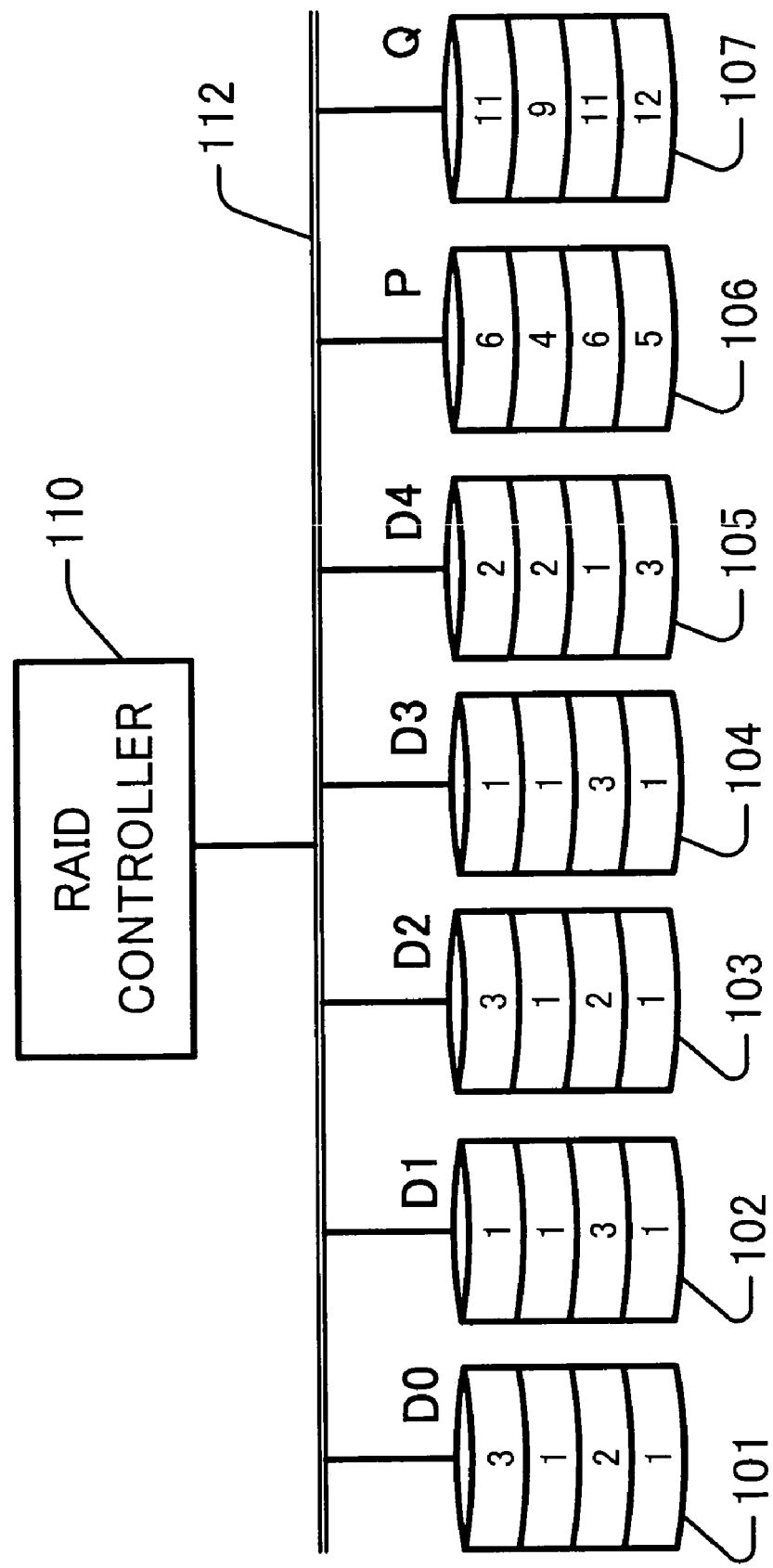
FIG. 8 is a block diagram illustrating the configuration of an example of a RAID-6 system of the related art.
Figure 9:
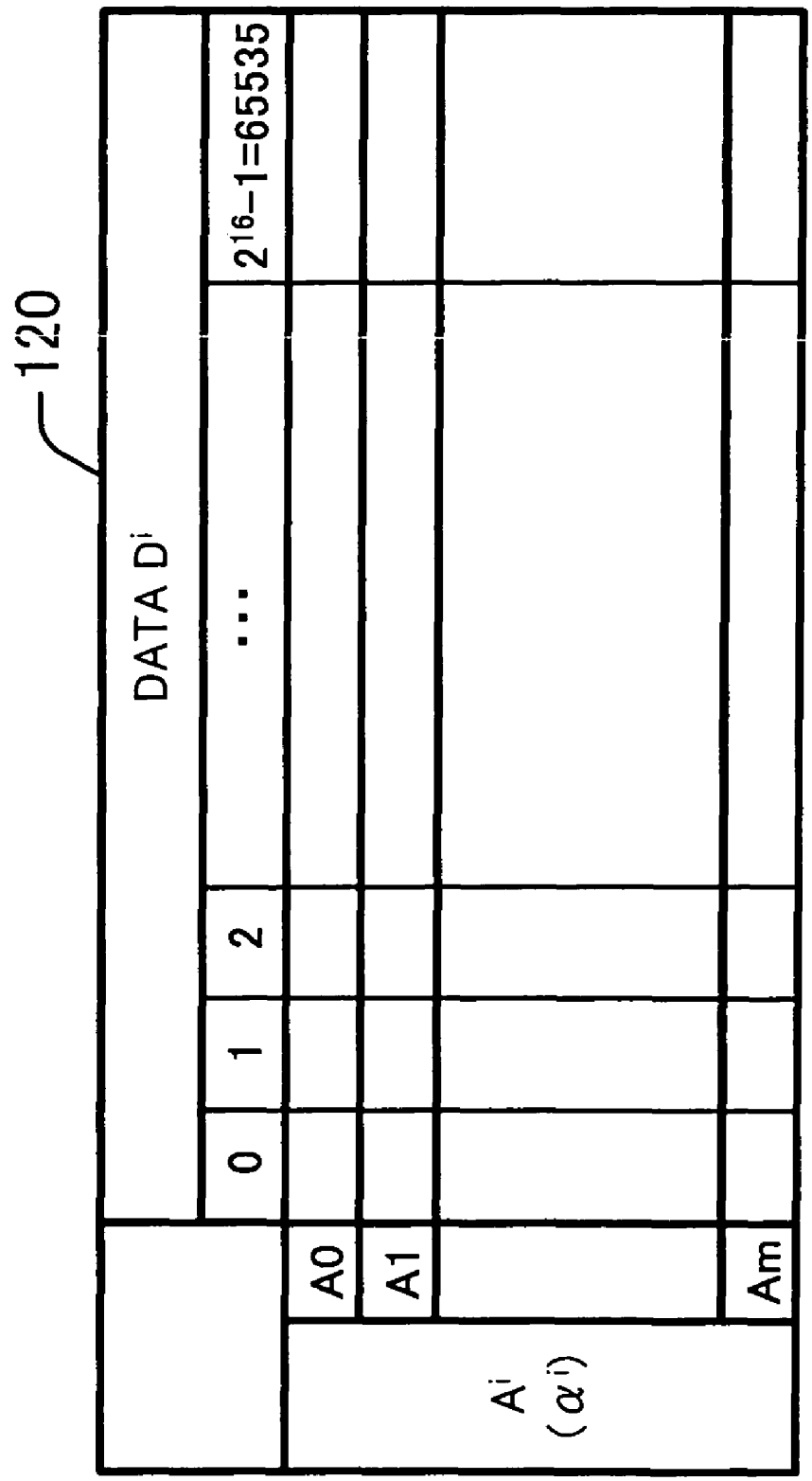
FIG. 9 illustrates a Galois field product computation table used for an example of a RAID-6 system of the related art.

FIG. 1 is a block diagram illustrating a RAID system in accordance with an embodiment of the present invention. FIG. 2 illustrates a Galois field product computation table and a computation circuit for generating parities and recovering data in the RAID system shown in FIG. 1, in accordance with an embodiment of the present invention. FIG. 3 illustrates parity generation and data recovery computation performed by the RAID-6 system shown in FIG. 1. The RAID system includes, as shown in FIG. 1, a RAID controller 12 connected to a host computer 16, a plurality of (14 in this embodiment) data disk units (hard disk drives) 10-1 through 10-14, and two parity disk units (hard disk drives) 10-15 and 10-16, which are connected to the RAID controller 12 with, for example, a fiber channel (FC) loop 14 and which are controlled by the RAID controller 12. That is, the RAID system shown in FIG. 1 has a RAID-6 configuration having dual parities.

The RAID controller 12 includes, as shown in FIG. 2, a Galois field product computation table 20 and a computation circuit 22 for generating parity P and Q, and recovering data in the case of single disk failures or double disk failures by referring to the Galois field product computation table 20.

The Galois field product computation table 20 includes possible symbol values as first search key data (D: 0, 1, ..., 65535) thereof, weighting values (Galois field generators) as a second search key data (A: $\alpha^0$, ...) thereof, and products of possible symbol values indicated by the first search key data and weighting values indicated by the second search key data.

If one symbol has 16 bits, the Galois field $GF(2^{16})$ is used. The generation of parities and data recovery computation performed by the computation circuit 22 are discussed below with reference to FIG. 3.

The first parity P is generated, as shown in FIG. 3, by computing XOR of string data (symbols) D0 through D13 in the data disk units 10-1 through 10-14, respectively, and is stored at the corresponding address of a first parity disk unit 10-15. The second parity Q is generated, as shown in FIG. 3, by weighting the string data (symbols) D0 through D13 in the data disk units 10-1 through 10-14, respectively, by means of Galois field product computation and by computing XOR of the resulting weighted data, as in equation (1). The second parity Q is stored at the corresponding address of a second parity disk unit 10-16.

Sign + in FIG. 3 represents XOR computation. The primitive polynomial for the Galois field $GF(2^{16})$ is expressed by the following equation (15).

$$X^{16}+X^{12}+X^3+X+1 \tag{15}$$

Concerning the equation for recovering data, to recover data Di in the case of a single-disk failure, the following equation (16) is computed from equation (3).

$$Di = (Ai)^{-1} * (A0*D0 + \ldots + A(i-1)*D(i-1) + \\ A(i+1)*D(i+1) + \ldots + A13*D13 + Q) \tag{16}$$

To recover data Di and Dj in the case of double disk failures, the following equations (17) and (18) are computed from equations (12) and (13), respectively.

$$Dj = \tag{17}$$
$$(Ai+Aj)^{-1} * (A0*D0 + A1*D1 + \ldots + \underline{Ai*Di} + \ldots + \underline{Aj*Dj} + \ldots + \\ A13*D13 + Q + Ai*D0 + Ai*D1 + \ldots + \\ \underline{Ai*Di} + \ldots + \underline{Ai*Dj} + \ldots Ai*D13 + Ai*P)$$

$$Di = D0 + D1 + \ldots + \underline{Di} + \ldots Dj + \ldots D13 + P \tag{18}$$

In equations (17) and (18), the underlined terms are ignored when computing Di or Dj.

When writing data into the data disk units 10-1 through 10-14, the RAID controller 12 calculates the parity P by means of XOR computation and stores the calculated parity P in the first parity disk unit 10-15, and also obtains product computation results from the Galois field product computation table 20 and calculates the parity Q by performing XOR computation, which are discussed below, and then stores the calculated parity Q in the second parity disk unit 10-16.

Similarly, upon detecting a single disk failure when reading data from the data disk units 10-1 through 10-14 and the parity disk units 10-15 and 10-16, the RAID controller 12 obtains the product computation results from the Galois field product computation table 20 and executes XOR computation according to equation (16) to recover data Di.

Upon detecting double disk failures, the RAID controller 12 obtains the product computation results from the Galois field product computation table 20 and executes XOR computation according to equation (17) to recover data Dj, and also executes XOR computation according to equation (18) to recover data Di.

FIG. 4 illustrates the setting of Galois field generators (weighting values) used for data disk units in accordance with an embodiment of the present invention. FIG. 5 illustrates Galois field generators (weighting values) determined in accordance with the setting shown in FIG. 4. FIG. 6 illustrates a part of a Galois field product computation table in accordance with an embodiment of the present invention. FIG. 7 illustrates an example of a part of a Galois field product computation table of the related art for comparison with that shown in FIG. 6.

In this embodiment of the present invention, in order to reduce the number of Galois field generators necessary for weighting, overlapped portions of the weighting values for single-disk failures and the weights for dual-disk failures are increased. To implement this, Galois field generators should be selected in accordance with a certain regularity.

In the RAID system of this embodiment, N data (or N symbols) and two parities are used and N is lower than or equal to $2^m-1$ (m is an integer of two or greater). Preferably, N is a value close to $2^m-1$ (for example, N=3, 7, 14, 15, 30, 31, ...).

Under the above-described conditions, the weighting value (Galois field generator) Aj used for each data disk unit j is determined according to the following equation (19).

$$Aj = gfw(j,0) \cdot \alpha^0 + gfw(j,1) \cdot \alpha^1 + \ldots + gfw(j,m-1) \cdot \alpha^{m-1} \tag{19}$$

In equation (19), j represents the data disk number, wherein $1 \leq j \leq N$ where N is the number of data disk units, and m designates the number of bits used for one symbol. For example, if the number of data disk units is 14 and the number of bits used for one symbol is 4, $1 \leq j \leq 14$ and $\alpha^{m-1} = \alpha^3$. That is, the value of the weight (a weighting value, or Galois field generator) Aj for each data disk unit j is defined as a combination of $\alpha^0$ through $\alpha^3$.

The weighting value Aj can be assigned to j-th partial data block included in N partial data blocks which are generated by dividing original data into N parts. In this case, different partial data blocks can be stored in the same disk unit.

Then, the gfw matrix (gfw(j, 0), gfw(j, 1), ..., gfw(j, m−1)) in equation (19) is set for j, as shown in FIG. 4. That is, j in decimal notation is represented in binary notation, and the binary numbers are sequentially assigned to (gfw(j, 0), gfw(j, 1), ..., gfw(j, m−1)) from the LSB to the MSB.

With this operation, by computing XOR of the binary numbers (gfw(j, 0), gfw(j, 1), ..., gfw(j, m−1)) of two data disk numbers j shown in FIG. 4, the result becomes equal to the binary numbers (gfw(j, 0), gfw(j, 1), ..., gfw(j, m−1)) of another disk number j. A set of binary numbers (gfw(j, 0), gfw(j, 1), ..., gfw(j, m−1)) is also referred to as a weighting vector.

For example, the result of computing XOR of the binary number of j=1 and the binary number of j=2 becomes equal to the binary number of j=3, and the result of computing XOR of the binary number of j=2 and the binary number of j=3 becomes equal to the binary number of j=1.

That is, this set (matrix) of weighting values is closed under addition (XOR). If the setting of the weighting values shown in FIG. 4 is applied to equation (19) and if the weighting value (or Galois field generator) of each data disk number j is represented by Ai, Ai can be indicated, as shown in FIG. 5.

The result of computing XOR of the weighting values for two data disk units becomes equal to the weighting value for another disk data unit. Such a weighting value is assigned to each data disk unit, as shown in FIG. 5.

For example, the weighting value assigned to j=3 ($\alpha^0+\alpha^1$) is represented by $\alpha^{49594}$. From the above-described primitive polynomial shown in FIG. 3, the following equation (20) holds true.

$$\alpha^6=\alpha^2+\alpha^3+\alpha+1 \quad (20)$$

By modifying the weighting value assigned to j=3 to a single Galois field generator according to the above-described rule for four arithmetic operations, the weighting value ($\alpha^0+\alpha^1$) assigned to j=3 can be represented by the weighting value $\alpha^{49594}$. The same applies to a case where the weighting value of other Galois field generators obtained by XOR computation is modified to the weighting value of a single Galois field generator.

The weighting value used for recovering data from a single disk failure is the multiplicative inverse of the weighting value assigned to the corresponding data disk number. Accordingly, the weighting value A1j used for a single disk failure can be expressed by the following equation (21).

$$A1j = (gfw(j, 0) \cdot \alpha^0 + gfw(j, 1) \cdot \alpha^1 + \ldots + gfw(j, m-1) \cdot \alpha^{m-1})^{-1} \quad (21)$$

Also in equation (21), $1 \leq j \leq N$, where j is the data disk number in which a single disk failure has occurred, N is the number of data disks, and m designates the number of bits used for one symbol.

The weighting values used for double disk failures are as follows. To recover data from double disk failures, XOR computation of two Galois field generators is required, as expressed by equation (12). However, since the set of weighting values shown in FIG. 4 used for selecting the weighting values for the data disk numbers is closed under XOR, the weighting values can also be used for double disk failures.

That is, since the weighting value A2j used for double disk failures is the multiplicative inverse of XOR of two Galois field generators (or weighting values), the weighting value A2j coincide with some of the weighting values used for a single disk failure. Accordingly, the weighting value A2j used for double disk failures can be expressed by the following equation (22).

$$A2j = (gfw(j, 0) \cdot \alpha^0 + gfw(j, 1) \cdot \alpha^1 + \ldots + gfw(j, m-1) \cdot \alpha^{m-1})^{-1} \quad (22)$$

where j indicates the pointer for a weighting value used for double disk failures, and the range of j is $N+1 \leq j \leq (2^m)-1$. For example, if the number of data disk units N is 14 and if m is 4, as stated above, it is sufficient that only j=15 is added as the weighting value used for double disk failures.

As described above, unlike an example of the related art in which the weighting values are randomly selected, in this embodiment of the present invention, only a small number of weighting values used for double disk failures is to be added. The reason of this is as follows. To recover data from double disk failures, XOR of two Galois field generators (weighting values) is required, as expressed by equation (12). However, since the set of weighting values shown in FIG. 4 used for selecting the weighting values for the data disk numbers is closed under addition (XOR), they can also be used for double disk failures.

In this case, the number of data elements included in a Galois field product computation table is only $(n+2^m-1) \times 65536$, where each data element includes a product of the first search key data and the second search key data. For example, if N is 14, m is 4, and only $(14+16-1)=29 \times 65536$ data elements are required for a Galois field product computation table.

Accordingly, compared with the data amount of 119×65536 tables required for the above-described random selection technique of the related art, the size of the tables of this embodiment is smaller by 0.24, i.e., about ⅕. Thus, the memory space required for the tables can be saved.

This is specifically described below by way of example with reference to FIGS. 6 and 7. In FIGS. 6 and 7, it is assumed that the number N of data disk units is 15. If the weighting values are randomly selected, as shown in FIG. 7, for the data disk number j, i.e., if the weighting value $\alpha^j$ is selected for the data disk number j, no mathematical rule can be observed in the relationship among the weighting values, e.g., a set of the weighting values is not closed under addition (XOR).

The weighting value used for recovering data from a single disk failure is the multiplicative inverse of the weighting value. For example, if $\alpha^1$ is used for the data disk number j=1, the weighting value $\alpha$ raised to the power of $(2^{16}-1--1)=(65536-2)=65534$, i.e., $\alpha^{65534}$, which is the multiplicative inverse of $\alpha^1$, is used. The same applies to other data disk numbers.

The weighting value used for recovering data from double disk failures is the multiplicative inverse of the XOR result of the weighting values for two data disk numbers according to equation (17). For example, the weighting value used for recovering data from double disk failures occurring in the data disk numbers j=0 and j=1 is $(\alpha^0+\alpha^1)^{-1}$, i.e., $\alpha^{15941}$.

Since there is no mathematical relationship among the weighting values used for the data disk numbers, as shown in FIG. 7, the weighting values used for single disk failures cannot be used for recovering double disk failures. The same applies to double disk failures occurring in the data disk number j=1 and one of the data disk numbers j=2 to j=14, and it is necessary to use different weighting values.

In contrast, according to this embodiment of the present invention, as shown in FIG. 6, the weighting values based on the rule that a set of weighting values is closed under addition (XOR), as discussed with reference to FIGS. 4 and 5, are used. That is, the weighting value for a certain data disk number j is equal to the XOR result of the weighting values for other two data disk numbers.

As in the related art, the weighting value used for recovering data from a single disk failure is the multiplicative inverse of the weighting value. For example, for a single disk failure occurring in the data disk number j=2, $2^{16}-1-49594=65536-49595=15941$, i.e., $\alpha^{15941}$, which is the multiplicative inverse of $\alpha^{49594}$, is used as the weighting value. The same applies to other data disk numbers.

The weighting value used for recovering data from double disk failures occurring in two data disk numbers is the multiplicative inverse of the XOR result of the weighting values for the two data disk numbers according to equation (17). For example, the weighting value used for recovering data from double disk failures occurring in the data disk numbers j=0 and j=1 is $(\alpha^0+\alpha^1)^{-1}$, i.e., $\alpha^{15941}$.

That is, this weighting value coincides with that used for recovering the data in the data disk number j=2 from a single disk failure. This is because the weighting value Ai for the data disk number j=2 is equal to the XOR result of the weighting values for the data disk numbers j=0 and j=1.

Similarly, the weighting value used for recovering data in the data disk number j=0 and one of the data disk numbers j=2 to j=14 from double disk failures coincides with the weighting value used for a single disk failure occurring in the corresponding disk number.

For a reason similar to that described above, as the weighting value used for recovering data in the data disk number j=1 and one of the data disk numbers j=2 to j=14 from double disk failures, the weighting value used for a single disk failure occurring in the corresponding disk number can be used, as shown in FIG. 6.

In the example shown in FIG. 6, since n=15, the weighting values used for single disk failures can be used for recovering data from double disk failures, and it is not necessary to set weighting values specially used for double disk failures.

The number of rows (indicated by the second search key data) of the Galois field product computation table 20 shown in FIG. 2 is equal to the sum of the number of weighting values for data disk numbers, the number of weighting values used for single disk failures, and the number of additional weighting values, as expressed by equation (22). That is, unlike the related art, rows for weighting values used for recovering data from double disk failures are not necessary. Thus, the data size of the Galois field product computation table 20 is smaller than the Galois field product computation table 120 of the related art by ⅕, which is effective for saving the memory space and also contributes to increasing the speed of data recovery using a table.

In the Galois field product computation table 20 shown in FIG. 2, the set of weighting values for data disk numbers becomes a weighting value set, and the set of weighting values used for single disk failures and the additional weighting values becomes a inversed weighting value set.

In the above-described embodiments, the RAID-6 system has 14 data disk units and two parity disk units. However, the number of data disk units and the number of party disk units are arbitrary.

Recovery of data from single disk failures or double disk failures has been discussed in the context of recovery of data in the storage units of the RAID-6 system. However, this data recovery technique can be used when parities P and Q are provided for a plurality of symbols and the resulting data is transferred. For example, by dividing original data into N partial data blocks and assigning a weighting value to each of the N partial data blocks, it is possible to recover the original data from a single failure or double failures of the N partial data blocks, in accordance with the present invention. In this case, the Galois field product computation is performed on symbols acquired from the N partial data blocks and each of the N partial data blocks is not necessarily stored in different data storages (disk units).

While the present invention has been described with reference to exemplary embodiments, it is to be understood that the invention is not limited to the disclosed exemplary embodiments, and various modifications are possible within the spirit of the invention.

What is claimed is:

1. An apparatus for recovering data, comprising:
a controller for recovering data in the case of a single or double failures of N partial data blocks generated by dividing the data where N is a natural number greater than 1, the controller recovering the data on the basis of a first parity data generated by combining the N partial data blocks, a second parity data generated by performing in a Galois field a product operation on symbols acquired from the N partial data blocks, and a Galois field product computation table including first search key data, a second search key data, and a product of the first key and the second search key data for each pair of the first search key data and the second search key data, the first search key data including possible symbol values, the second search key data including a weighting value set and an inversed weighting value set, the weighting value set including weighting values each assigned to one of the N partial data blocks and different from each other, the weighting value set being closed under addition in the Galois field, the inversed weighting value set including weighting values each being a multiplicative inverse of one of the weighting values included in the weighting value set, wherein
the controller recovers the data in the case of double failures of the N partial data blocks by using weighting values included in the inversed weighting value set of the Galois field product computation table.

2. The apparatus of claim 1, further comprising:
N data storages each storing one of the N partial data blocks; and
a parity storage for storing the first parity data and the second parity data, wherein
the controller recovers data in the case of double failures of the N data storages by using weighting values included in the inversed weighting value set of the Galois field product computation table.

3. The apparatus of claim 1, wherein the controller recoveries a failed partial data block in the case of a single failure of the N partial data blocks, by searching the Galois field product computation table by using, as the first search key data, symbols acquired from partial data blocks other than the failed partial data block and using, as the second search key data, a multiplicative inverse of a weighting value assigned to the failed partial data block, and recoveries failed partial data blocks in the case of double failures of the N partial data blocks, by searching the Galois field product computation table by using, as the first search key data, symbols acquired from partial data blocks other than the failed partial data blocks and using, as the second search key data, a weighting value generated from weighting values assigned to the failed partial data blocks.

4. The apparatus of claim 3, wherein, in the case of double failures of the N partial data blocks, the controller performs a product operation for partial data blocks other than the failed partial data blocks by searching the Galois field product computation table by using, as the first search key data, symbols acquired from partial data blocks other than the failed partial data blocks and using, as the second search key data, weighting values assigned to partial data blocks other than the failed partial data blocks, performs an EOR operation on among results of the product operation, and recoveries the failed partial data blocks by searching the Galois field product computation table by using, as the first search key data, a result of the EOR operation and using, as the second search key data, a weighting value obtained from weighting values assigned to the failed partial data blocks.

5. The apparatus of claim 4, wherein the controller generates the second parity data Q by computing products of symbols from D1 to Dn and weighting values from A1 to An, respectively, and performing an EOR operation on among the computed products, and recovers symbols Dj and Di by using the following equation (17) and (18), respectively:

$$Dj = (Ai + Aj)^{-1} * (A0*D0 + A1*D1 + \ldots + \underline{Ai*Di} + \ldots + \underline{Aj*Dj} + \ldots + A13*D13 + Q + Ai*D0 + Ai*D1 + \ldots + \underline{Ai*Di} + \ldots + \underline{Ai*Dj} + \ldots Ai*D13 + Ai*P) \quad (17)$$

and $$Di = D0 + D1 + \ldots + \underline{Di} + \ldots Dj + \ldots D13 + P \quad (18)$$

where under lined terms are ignored when computing symbols Dj or Di.

6. The apparatus of claim 5, wherein the weighting values from A1 to An is defined by following equation (19):

$$Aj = gfw(j,0)\cdot\alpha^0 + gfw(j,1)\cdot\alpha^1 + \ldots + gfw(j,m-1)\cdot\alpha^{m-1} \quad (19)$$

where j is an integer ranging from 1 to N, and gfw(j,i) is a binary value equal to a value of (i+1)-th bit from the LSB in binary notation of j where i is a bit address ranging from 0 to m−1 and indicates a position of (i+1)-th bit from the LSB in binary notation of j, thereby generating a set of the weighting values Aj as the weighting value set which is closed under addition in the Galois field.

7. The apparatus of claim 6, wherein a weighting value for recovering a failed partial data block in the case of a single failure of the N partial data blocks is a multiplicative inverse $Aj^{-1}$ of the weighting value Aj assigned to the failed partial data block.

8. The apparatus of claim 7, wherein a weighting value for recovering failed partial data blocks in the case of double failures of the N partial data blocks is a multiplicative inverse of a result of an EOR operation performed on two weighting values assigned to the failed partial data blocks.

9. The apparatus of claim 3, wherein N is a natural number less than or equal to $2^m-1$ where m is a natural number greater than 1 and indicates the number of bits for use included in one symbol.

10. The apparatus of claim 9, wherein N is configured to be a natural number close to $2^m-1$.

11. The apparatus of claim 9, wherein, in the case of a Galois field $GF(2^k)$ where k is a natural number, the Galois field product computation table is configured to include $2^k$ keys as the first search key data, $(N+2^m-1)$ keys as the second search key data, and a total of $(N+2^m-1)\times 2^k$ data elements each including a product of the first search key data and the second search key data in the Galois field $GF(2^k)$.

* * * * *